US007382126B2

(12) United States Patent
Böttcher et al.

(10) Patent No.: US 7,382,126 B2
(45) Date of Patent: Jun. 3, 2008

(54) METHOD AND APPARATUS FOR DETECTION IMPROVEMENT OF A WEAKLY-SENSITIVE ATOMIC NUCLEUS TYPE IN MR SPECTROSCOPY

(75) Inventors: Uwe Böttcher, Uttenreuth (DE); Stefan Röll, Seigendorf (DE)

(73) Assignee: Siemens Aktiengesellschaft, Muinch (DE)

(*) Notice: Subject to any disclaimer, the term of this patent is extended or adjusted under 35 U.S.C. 154(b) by 0 days.

(21) Appl. No.: 11/510,199

(22) Filed: Aug. 25, 2006

(65) Prior Publication Data
US 2007/0052416 A1   Mar. 8, 2007

(30) Foreign Application Priority Data
Aug. 26, 2005  (DE)  ............ 10 2005 040 540

(51) Int. Cl.
*G01V 3/00* (2006.01)
(52) U.S. Cl. ............... 324/307; 324/309
(58) Field of Classification Search ........ 324/300–322
See application file for complete search history.

(56) References Cited
U.S. PATENT DOCUMENTS

| | | | | |
|---|---|---|---|---|
| 4,339,717 A * | 7/1982 | Tsuda et al. | ............ | 324/313 |
| 4,922,203 A * | 5/1990 | Sillerud et al. | ............ | 324/307 |
| 5,111,819 A * | 5/1992 | Hurd | ............ | 600/410 |
| 5,113,138 A * | 5/1992 | Bomsdorf et al. | ............ | 324/307 |
| 5,539,315 A * | 7/1996 | Cory et al. | ............ | 324/318 |
| 6,005,390 A * | 12/1999 | Watanabe et al. | ............ | 324/307 |
| 6,111,408 A * | 8/2000 | Blades et al. | ............ | 324/303 |
| 6,111,409 A * | 8/2000 | Edwards et al. | ............ | 324/303 |
| 6,577,125 B2 * | 6/2003 | Prammer et al. | ............ | 324/303 |
| 6,815,950 B2 * | 11/2004 | Speier | ............ | 324/303 |
| 6,958,604 B2 * | 10/2005 | An et al. | ............ | 324/303 |
| 7,126,332 B2 * | 10/2006 | Blanz et al. | ............ | 324/303 |
| 7,205,762 B2 * | 4/2007 | Blanz et al. | ............ | 324/303 |

OTHER PUBLICATIONS

In Vivo 3D Localized $^{13}$C Spectroscopy Using Modified INEPT and DEPT Journal of Magnetic Resonance 134, 214-222 (1998).

* cited by examiner

*Primary Examiner*—Brij Shrivastav
*Assistant Examiner*—Dixomara Vargas
(74) *Attorney, Agent, or Firm*—Schifff Hardin LLP

(57) ABSTRACT

In a method and apparatus for detection improvement of a weakly-sensitive atomic nucleus type in MR spectroscopy data acquisition using polarization transfer for a strongly-sensitive atomic nucleus type (A) with involvement of an MR-active, weakly-sensitive atomic nucleus type (X), all RF pulses are radiated sequentially, i.e. with defined time interval relative to one another, such that at no point in time of the sequence are different RF pulses radiated simultaneously or overlapping, and the sequence of the RF pulses causes a polarization transfer of the two involved atomic nucleus types (A), (X).

12 Claims, 9 Drawing Sheets

Time

Frequency

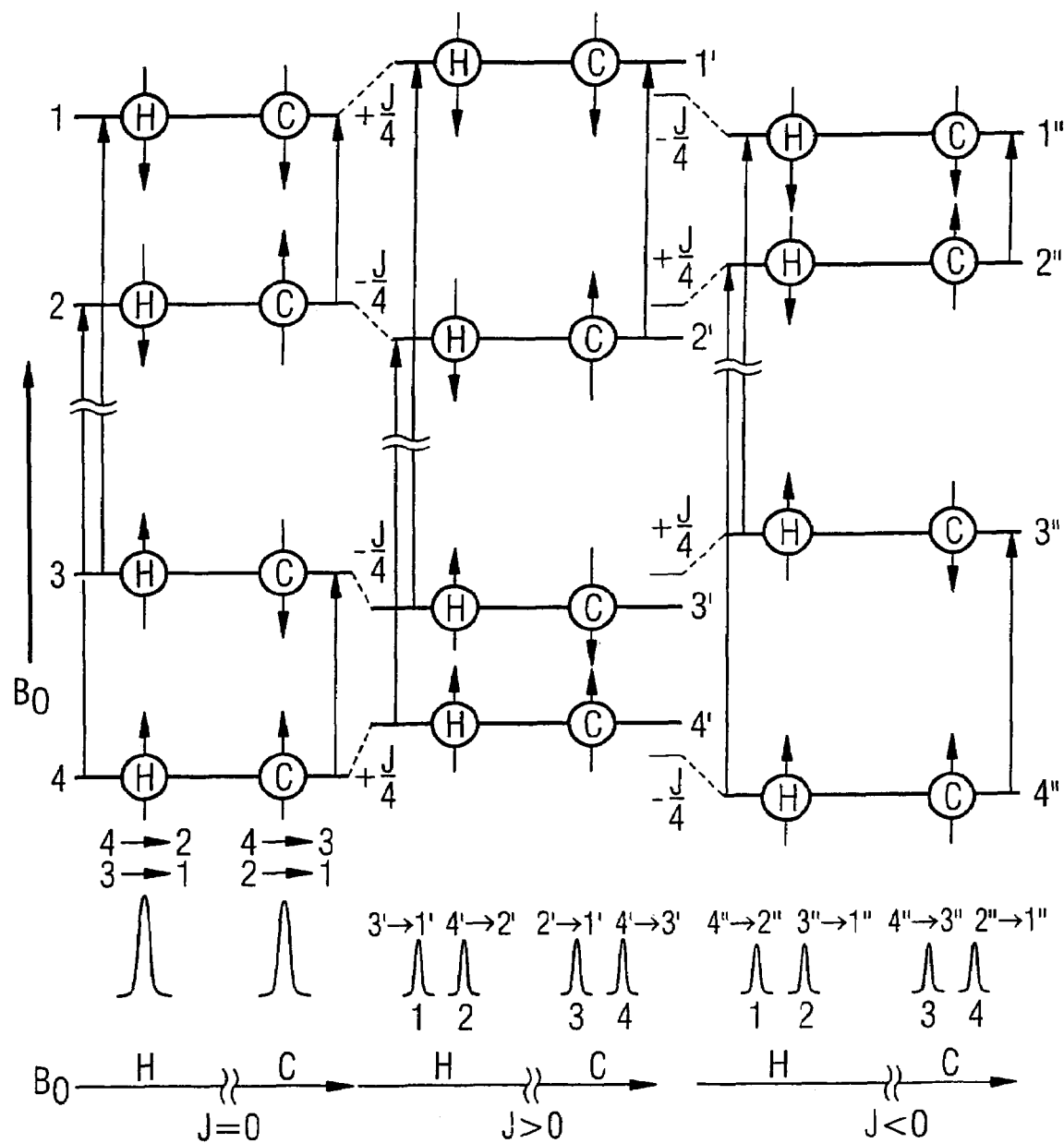

METHOD AND APPARATUS FOR DETECTION IMPROVEMENT OF A WEAKLY-SENSITIVE ATOMIC NUCLEUS TYPE IN MR SPECTROSCOPY

BACKGROUND OF THE INVENTION

1. Field of the Invention

The present invention generally concerns magnetic resonance spectroscopy (MRS) as it has been applied in radiological diagnostics for examination of biochemical and metabolic processes in the human body (called "in vivo spectroscopy"). The present invention in particular concerns improvements in MRS data acquisition methods as well as apparatuses for implementation of such methods wherein a polarization transfer is used for signal amplification of difficult-to-detect atomic nuclei types.

2. Description of the Prior Art

Like magnetic resonance tomography (MRT), magnetic resonance spectroscopy (MRS) is based on the phenomenon of magnetic resonance (discovered in 1946) that was first used in basic research to measure the magnetic properties of nuclei. Only when it was observed in the 1960's that the magnetic resonance signal (MR signal) of a nucleus is also influenced by its chemical environment and that this "chemical shift" can be used to characterize chemical substances, did "high resolution MR" in vitro become established. This has been successfully in physical, chemical, biochemical and pharmaceutical research, and compositional for analysis and structural analysis of complex macromolecules.

In the early 1980's it was discovered that the magnetic resonance signal, due to its dependency on the chemical environment (water tissue or fatty tissue), represents the basis for a medical non-invasive imaging technique that, as magnetic resonance tomography (MRT), to date represents one of the most important radiological examination modalities in medicine.

It was also recognized that the imaging signals in magnetic resonance tomography additionally provide chemical information that can be evaluated for examination of biochemical reactions and of metabolic processes in the living body. This was designated spatially-resolved spectroscopy on the living organism or "in vivo spectroscopy" in the living organ or "clinical magnetic resonance spectroscopy" (MRS) in contrast to the "high-resolution MR" in vitro, which normally ensues in the laboratory and thus in contrast to pure imaging magnetic resonance tomography (MRT).

The physical bases of magnetic resonance are briefly explained in the following:

The subject (patient or organ) to be examined is exposed to a strong, constant magnetic field both in MRS and in MRT. The nuclear spins of the atoms in the subject, which were previously randomly oriented, thereby align, causing discrete energy states to arise. Radio-frequency energy can now produce transitions between these energy levels. For example, if an equal occupation of the states is achieved by a radio-frequency pulse, an induced signal can thus be detected by the reception coil after the deactivation of the exciting RF field. The measurement subject can be selectively excited and the signals can be spatially coded by the use of non-homogeneous magnetic fields generated by gradient coils.

The acquisition of the data in MRS ensues in the time domain. The acquisition of MRT data ensues in k-space (frequency space domain). The MR spectrum in the frequency domain, and the MRT image in the image domain, are linked with the measured data by means of Fourier transformation.

A volume excitation in the subject thus ensues by means of slice-selective radio-frequency pulses with simultaneous application of gradient pulses. For the excitation of a cuboid in MRS, three slice-selective radio-frequency pulses are applied in three orthogonal spatial directions. These are normally three sinusoidal, Gaussian or hyperbolic RF pulses that are radiated into the subject to be examined simultaneously with rectangular or trapezoidal gradient pulses. The radiation of the RF pulses ensues via one or more RF antennas.

By the combination of the aforementioned pulses a frequency spectrum in the range of the resonant frequency that is specific for a nucleus type is radiated into the (normally cuboid) region of the subject to be examined. The respective nuclei in the selected (excited) region (volume of interest, VOI) respond by emitting electromagnetic signals that are detected in the form of a sum signal (free induction decay signal, FID signal) or in the form of a (half), echo signal, such as a spin echo signal, in a special acquisition mode of the RF antennas. The analog signal (FID or echo) is sampled by switching of an ADC (analog-digital converter), digitized and stored in a storage unit, or is Fourier-transformed, so that a "spectrum" can be shown on a visualization unit (monitor).

The two components of the measured (FID or echo) signal describe the projections of the temporal oscillation behavior (already known as Lamor precession of the nuclear magnetization vector $\overline{M}$ in the x-y plane of a stationary reference system (laboratory coordinate system).

The temporal decay of the signal is determined by the $T_2$ weighted transverse relaxation (spin-spin relaxation). The transverse relaxation leads to the subsidence of the time-dependent transverse magnetization $\overline{M}_{xy}(t)$, while the $T_2$ time (more precisely called the $T_2^*$ time, which, according to the equation $$\frac{1}{T_2^*} = \frac{1}{T_2} + \gamma \Delta B_0, \qquad (1)$$

takes into account local $B_0$ field inhomogeneities $\Delta B_0$) determines the decay of the FID or echo signal as a characteristic time constant. $\gamma$ is the gyromagnetic ratio, which is the energetic coupling constant of the respective nucleus at the external magnetic field and is an invariable constant of the respective nucleus type.

The complex and time-dependent (thus three-dimensional) FID or echo signal itself is the electromagnetic response to one or more previously-radiated, circularly-polarized radio-frequency excitation pulses into the substance or into the tissue to be examined.

If the substance contains only a single nucleus type (for example protons in pure water) and if the RF excitation pulse radiates with a frequency that exactly corresponds to the Lamor frequency of the protons (63.8 MHz at 1.5 Tesla), the measured FID or echo signal of the water protons contains no harmonic/periodic components (sinusoidal and cosinusoidal components) since in a rotating (at 63.8 MHz) reference system no precession rotation of the transversal magnetization occurs. (The relative movement in the rotation direction is equal to zero). Only the relaxation-dependent exponential decay of the transversal magnetization vector, which represents a non-modulated exponential function (dashed curve in FIG. 2A), is measurable.

If the radiated RF excitation pulse exhibits a frequency that does not exactly correspond to that of water protons (for example 63.8 MHz+400 Hz), an excitation of the protons will still occur due to the pulse width, but the measured FID or echo signal (given a reference frequency for the data acquisition equal to the frequency of the RF pulse) contains a harmonic of a 400 Hz component that, according to FIG. 2A, is modulated to the exponential relaxation decay $$e^{\frac{-t}{T_2}}.$$

In the general case, the substance or the subject to be examined (in medical in vivo spectroscopy) will contain not just one nucleus type (1H, 31P, 13C) but rather a multiple of nucleus types to be analyzed. Moreover, the nuclei of the same nucleus type will exhibit different resonances (Lamor frequencies) relative to one another due to their different bonding in different molecules (different chemical environment) and can differ as what are known as metabolites.

In (in vivo) proton spectroscopy the resonance range of the signals is 10 ppm (parts per million) at approximately 63.8 MHz, the spectral width for (in vivo) phosphor spectroscopy lies at 26 MHz at approximately 30 ppm, and for (in vivo) 13C spectroscopy the resonances are distributed in the spectra across a range of 200 ppm at approximately 16 MHz (these specifications apply for 1.5 Tesla). The specification of the resonance frequency change δ relative to the system frequency (RF center frequency $v_0$) in ppm, thus in millionths of the resonance frequency according to the equation $$\delta = \frac{v_{Substance} - v_0}{v_0} \cdot 10^6, \quad (4)$$

is independent of the magnetic field strength.

In the general case, the FID or echo signal thus represents a temporally-dependent response signal—"signal representation in the time domain"—with an exponential curve in which all resonances ($\omega_x$, x∈N) of the excited nuclei in the respective-metabolites are modulated superimposed and frequency-coded.

An FID signal that (according to FIG. 2A) contains the frequency response of only a single metabolite, supplies only one resonance line according to FIG. 2B.

An FID signal that contains the frequency responses, as an example, of three different metabolites is shown in FIG. 3A. It can be seen that the FID or echo signal in FIG. 3A is coded in a significantly more complex manner than the FID or echo signal of FIG. 2A, which exhibits only one frequency. The components can be separated (extracted) by a Fourier transformation and can be sorted according to their respective resonance frequencies, so that according to FIG. 3B a three-component spectrum is obtained with resonance lines at $\omega_0$, $\omega_1$ and $\omega_2$.

The Fourier-transformed result of the FID or echo signal (FIGS. 2B, 3B) is generally designated as a spectrum, also called a "signal representation in the frequency domain".

As already mentioned, the gyromagnetic ratio γ (equation (1)) is an invariable constant of the respective atomic nucleus type (for example for the proton γ/2π=42.577 MHz/T), and with a constant external magnetic field slightly different resolution frequencies are considered in MR data in which the examined atomic nuclei are integrated into different molecules. The electrons in the molecule that participate in the chemical bond are responsible for this. They shield the external magnetic field such that the atomic nucleus "sees" different magnetic fields ($B_K$) depending on the bond type, which is caused by the already-mentioned slight shift of the respective resonant frequency and is known as a "chemical shift $\delta_K$":

$$B_K = B_0 - \delta_K B_0 \quad (5)$$

A number of resonance lines that can be associated with individual molecule groups often occur in a molecule complex. According to equation (4), the chemical shift is for the most part quantitatively specified in ppm relative to a reference line ($v_0$).

Aside from the chemical shift, one often also still observes a fine division of the nuclear magnetic resonance lines in the form of multiplet lines (doublets, triplets, quartets etc.). The magnetic interaction (spin-spin coupling) between the nuclei is responsible for this. This interaction is not transferred directly into the spectrum, but rather indirectly via the electrons of the chemical bond. For analysis of spectra with fine structure one typically uses the energy function (Hamilton operator $\hat{H}$) with the interaction energy $J_{kl}$ (scalar energy coupling constant) between the various spin states $\vec{J}_k$ and $\vec{J}_l$ $$\hat{H} = -\sum \gamma \hbar B_0 (1-\delta_k) \hat{J}_{zk} + \sum_{k,l} J_{kl} \hat{\vec{J}}_k \hat{\vec{J}}_l \quad (6)$$

the eigenvalues and eigenfunctions of which must describe the measured spectrum corresponding to the adopted molecule model. The structure of (macro-) molecules is identifiable in this manner in physical chemistry and biochemistry. In medicine, typical metabolites can be detected non-invasively in vivo using their spectrum.

The low sensitivity with regard to magnetic resonance in protons and other nuclei (for example $^{19}F$, $^{203}Tl$, $^{205}Tl$, $^{31}P$) with relatively large magnetic moments thereby no longer represents a problem due to the achievable high magnetic field strength of modern MR apparatuses. All other MR-active atomic nuclei types (with the exception of $^3H$) are even less MR-sensitive than the cited nuclei, so detectability thereof is more difficult due to low natural occurrence and long relaxation times, which is why methods for detection improvement or signal amplification in (in vivo) MR are of high importance.

A known class of methods for detection improvement of weakly-sensitive atomic nuclei in MR spectroscopy is based on the phenomenon known as polarization transfer, in which the high population difference of two or more energy levels that is dominant (standard) for a sensitive nucleus is transferred to the spin system of a coupled, insensitive nucleus by spin-spin coupling.

The principle of polarization transfer-based detection improvement is explained in detail in the following:

In a simplified manner, a two-spin system composed of a sensitive nucleus and an insensitive nucleus (for example $^1H$ and $^{13}C$) is considered.

In a magnetic field $B_0$, such nuclei (quantum spin number ½) can respectively adopt two discrete energy states. The change of such an energy level is associated with absorption or emission of a quantum $$\hbar\omega = \Delta E = \gamma \hbar B_0 \quad (7)$$

The occupation of the energy level in the external magnetic field $B_0$ ensues according to the Boltzmann statistic $$\frac{N_q}{N_p} = e^{\frac{\Delta E}{kT}} \approx 1 - \frac{\gamma \hbar B_0}{kT} \quad (8)$$

The result is an excess of nuclear magnetic moments aligned parallel to the magnetic field $B_0$.

The gyromagnetic ratio $\gamma$ of the appertaining nucleus (which changes its spin alignment given the transition $E_p \to E_q$) is decisive for the occupation difference (population difference) between two states $E_q$ and $E_p$. A greater population difference results for states that belong to the transitions of a sensitive nucleus type A (large $\gamma$) than for those that belong to the transitions of an insensitive nucleus type X (small $\gamma$).

The population in the term scheme (energy level diagram) of such an AX system composed of a strongly sensitive nucleus (A) and a weakly sensitive nucleus (X) is schematically shown in FIGS. 4A, 4B and 4C.

If exchanging the appertaining spin populations is achieved by a (selective) population inversion for an A line (A1 or A2) in the MR spectrum, the term scheme of FIG. 4B applies, that shows amplified absorption (X1) and amplified emission (X2) for the X transitions, and the term scheme of FIG. 4C applies, wherein X1 shows amplified emission and X2 shows amplified absorption. In both cases (FIGS. 4B, 4C) the population equilibrium is disturbed via selective population inversion between the states (1) and (3) or between the states (2) and (4).

The prior population difference, decisive for the sensitive nucleus and corresponding to the signal intensity, now applies for the insensitive nucleus. This phenomenon is known as polarization transfer, which is used for signal amplification of NMR-insensitive atomic nuclei.

Of most general interest is the sensitivity improvement in $^1$H-coupled spectra of insensitive nuclei, such as, for example, $^{13}$C (but also $^{15}$N or $^{29}$Si), thus the intensity increase for $XA_n$ spin systems with A=$^1$H and X=$^{13}$C.

The energy level diagram of a CH spin system (n=1) with different coupling is shown in FIGS. 5A, 5B and 5C.

FIG. 5A shows the four energy levels 1, 2, 3 and 4 that are possible based on different C-H spin adjustments without coupling to the external magnetic field $B_0$, meaning that J=0 applies for the scalar energy coupling constant. Since in this case the $^1$H transitions 3→1 and 4→2, and the $^{13}$C transitions 2→1 and 4→3 are equally energetic, only an $^1$H line and a $^{13}$C line respectively result in the spectrum (no division and no hyper-fine structure).

The system behaves differently in FIGS. 5B and 5C, in which an energetic coupling of the C-H spin states ensues, whereby in the case of FIG. 5B the energy level of the parallel spin states (↑↑, ↓↓) is increased by J/4 and that of the antiparallel spin states (↑↓, ↓↑) is decreased by J/4. In the case of FIG. 5C, the system behaves precisely opposite. The coupling by ±J/4 results from the relation $$\gamma_{1H} = 4\gamma_{13C} \quad (9)$$

and leads in each case to respectively two energetic, different transitions of the respective atomic nucleus type, which respectively leads to a two-fold fine structure division in the spectrum, meaning respectively to two immediately adjacent spectral lines in the form of a doublet. Each nucleus species (type) thereby separately experiences a total energy change of J.

In order to calculate the population ratios (relative population or transition probabilities) relevant for the polarization transfer and thus for the respective signal amplification to be achieved, it is reasonable to consider the diagrams of FIGS. 4A and 4C more precisely, i.e. quantitatively (see FIGS. 6A, 6B, 6C).

In FIG. 6A the lowermost energy level possesses an energy of $$\frac{1}{2}\gamma_H + \frac{1}{2}\gamma_C$$

(this is proportional to the population probability) while the other energy levels have (in increasing order) energies or, population probabilities of $$\frac{1}{2}\gamma_H - \frac{1}{2}\gamma_C, \quad -\frac{1}{2}\gamma_H + \frac{1}{2}\gamma_C$$

and $$-\frac{1}{2}\gamma_H - \frac{1}{2}\gamma_C$$

corresponding to the respective coupled spin states ($\alpha\alpha$=↑↑=parallel to $B_0$), ($\alpha\beta$=↑↓), ($\beta\alpha$=↑↓), ($\beta\beta$=↓↓=antiparallel to $B_0$).

After a suitable (spin) preparation of the system by radiation of suitable electromagnetic radio-frequency pulses in the framework of a defined pulse sequence, targeted energy can be supplied to the system, such that the $\alpha\beta$ coupling changes (flips) into the energetically higher $\beta\beta$ coupling. After the preparation, the system thus has spin-spin pairs parallel ($\alpha\alpha$=↑↑) and antiparallel ($\beta\beta$=↓↓) to the $B_0$ field.

For simplicity, if the constant energy amount of $$\frac{1}{2}\gamma_H + \frac{1}{2}\gamma_C$$

is added to the energy level, the energy states $\gamma_H + \gamma_C$, $\gamma_H$, $\gamma_C$ and 0 are obtained. If the relative ratio of the nuclear sensitivities of $^1$H and $^{13}$C ($\gamma_H$=4 and $\gamma_C$=1), is also considered relative values of 5, 4, 1 and 0 result for the energy levels according to FIG. 6B. These values likewise correspond (as already mentioned) to the relative population probabilities or the relative populations since the magnetic moment $\bar{\mu}$ characterizing the sensitivity defines both the differences of the energy levels and the population probabilities (according to Boltzmann).

As can be seen from FIG. 6B, the population difference of the $^{13}$C transitions in the non-excited system is relatively low ($\Delta$=1−0=+1; $\Delta$=5−4=+1). The $^{13}$C doublet accordingly has a low MR sensitivity in comparison to the $^1$H doublet. If the system is now forced into a higher energy state (alignment of the spin pairs anti-parallel to $B_0$) via energy transfer, population differences of $^{13}$C transitions arise that produce an emission amplification of Δ=1−4=−3 as well as an absorption amplification of Δ=5−0=+5 in the spectrum (FIG. 6C).

This signal amplification of an X-doublet in the MR spectrum (for example X=$^{13}$C) is shown in FIG. 7A. The unit of the ordinate is arbitrary. What is important is the clear amplification of the two X-doublet lines.

The expansion to a 3-atom AX spin system (for example to a $CH_2$ group) leads to a much more complex term scheme and (as can be shown) to an X-triplet with the relative intensities (1)-(2)-(1) in the spectrum (FIG. 7B). A signal amplification leads to values of (−7)-(2)-(9) in this system.

The intensity increase that is obtained for the general expansion to $A_nX$ spin systems (A=$^1$H, X=$^{13}$C) can be determined according to FIGS. 8A and 8B by comparison with a Pascal triangle.

Shown are line number and relative intensities for an X-multiplet of an $A_nX$ group (A=$^1$H) given Boltzmann distribution (FIG. 8A) as well as after population inversion (FIG. 8B). The respective triangle is obtained by (combinatorial analysis) of the (whole-number) energy level transitions of the underlying term scheme.

The preparation of the spin system and therewith the achievement of polarization transfer can ensue using different RF pulse sequences. Best known is the INEPT method (Insensitive Nuclei Enhanced by Polarization Transfer, Morris, Freeman, J. Am. Chem. Soc. 101, 760-762 (1979)).

Further methods are, for example, refocused INEPT, DEPT (Distortionless Enhancement by Polarization Transfer), SINEPT, etc.

As is later explained in detail, all of these methods are generally based on the simultaneous application (radiation) of RF pulses at the different frequencies of the involved nucleus types (thus, for example, $^1$H, $^{13}$C). A disadvantage of this approach is that MR apparatuses that are not able to simultaneously emit at the various frequencies of the involved nuclei are not able to implement MR data acquisitions with polarization transfer.

SUMMARY OF THE INVENTION

An object of the present invention is to provide a method as well as an MR apparatus that allow MR data acquisitions with polarization transfer without the simultaneous application of RF pulses at different frequencies.

This object is achieved according to the invention by a method for detection improvement of a strongly-sensitive atomic nucleus type (A) in MR spectroscopy, based on polarization transfer with involvement of an MR-active, weakly-sensitive atomic nucleus type (X), wherein all RF pulses are radiated sequentially, i.e. with defined time intervals relative to one another, such that at no point in time of the sequence are frequency-differing RF pulses radiated simultaneously or overlapping, and wherein the sequence of the RF pulses causes a polarization transfer of the two involved atomic nucleus types (A), (X).

The inventive method in particular can be accomplished using the RF pulse sequence of a refocused INEPT sequence or a DEPT sequence, modified according to the invention.

The RF pulse sequence in the case of a refocused INEPT sequence is advantageously characterized by the following steps:

radiation of a first A-selective $90_x^{\circ}(A)$ RF pulse for excitation of the strongly-sensitive nucleus type (A),
radiation of a second A-selective $180_x^{\circ}(A)$ RF pulse after a time $T_1$ after the middle of the first RF pulse,
radiation of a third X-selective $180_x^{\circ}(X)$ RF pulse after the time $T_2$ after the middle of the second RF pulse,
radiation of a fourth A-selective $90_y^{\circ}(A)$ RF pulse after the time $T_3$ after the middle of the third RF pulse,
radiation of a fifth X-selective $90_x^{\circ}(X)$ RF pulse after the time $T_{22}$ after the middle of the fourth RF pulse,
radiation of a sixth X-selective $180_x^{\circ}(X)$ RF pulse after the time $T_4$ after the middle of the fifth RF pulse,
radiation of a seventh A-selective $180_x^{\circ}(A)$ RF pulse after a time $T_{23}$ after the middle of the sixth RF pulse,
acquisition of the X-nuclear magnetic resonance signals by readout of the FID signal after the time $T_5$ after the middle of the seventh RF pulse.

The time intervals newly introduced in accordance with the inventive modification of a refocused INEPT sequence are characterized as follows:

$T_1 = \frac{1}{4}J$, whereby J represents the XA coupling constant, $T_2$ is at least the sum of half of the second A-selective $180_x^{\circ}(A)$ RF pulse and half of the third X-selective $180_x^{\circ}(X)$ RF pulse, $$T_3 = T_1 + T_2,$$

$T_{22}$ is at least the sum of half of the fourth A-selective $90_y^{\circ}(A)$ RF pulse and half of the fifth X-selective $90_x^{\circ}(X)$ RF pulse, $T_4$ depends on the number of the protons (for example $$\tau_4 = \left(\frac{1}{6J}\right)$$

when the spectrum should comprise all multiplets), $T_{23}$ is at least the sum of half of the sixth X-selective $180_x^{\circ}(X)$ RF pulse and half of the seventh A-selective $180_x^{\circ}(A)$ RF pulse and $$T_5 = T_4 + T_{23}.$$

The present invention encompasses the above modification of pulse sequences also in the case of coupling for an arbitrary X multiplet of an $A_nX$ group, whereby n=1, 2, 3 . . .

The strongly-sensitive atomic nucleus type (A) can be $^1$H nuclei and the weakly-sensitive atomic nucleus type (X) can be $^{13}$C nuclei.

The above object also is achieved in accordance with the present invention by a magnetic resonance apparatus having a pulse sequence controller that is programmed to operate the apparatus to implement the above-described method.

DESCRIPTION OF THE DRAWINGS

FIG. 5A shows the term scheme of a CH spin system without coupling.

FIG. 5B shows the term scheme of a CH spin system with positive coupling (J>0).

FIG. 5C shows the term scheme of a CH spin system with negative coupling (J<0).

DESCRIPTION OF THE PRFFERRFD EMBODIMENTS

The methods of clinical MR spectroscopy differ from those of conventional MR tomography essentially only in that the chemical shift or the hyper-fine structure is resolved in addition to the spatial resolution. This can be achieved with conventional magnetic resonance tomography apparatuses, which is why these are used in clinical MR spectroscopy, and the inventive method (the modification of MR data acquisitions that utilize polarization transfer for detection improvement of insensitive nuclei) should also primarily be implemented in such apparatuses. The inventive method can also be applied in high field in vivo systems (presently up to 7 Tesla) that are developed and used alone as well as in high-resolution MR spectrometers.

Figure 1:
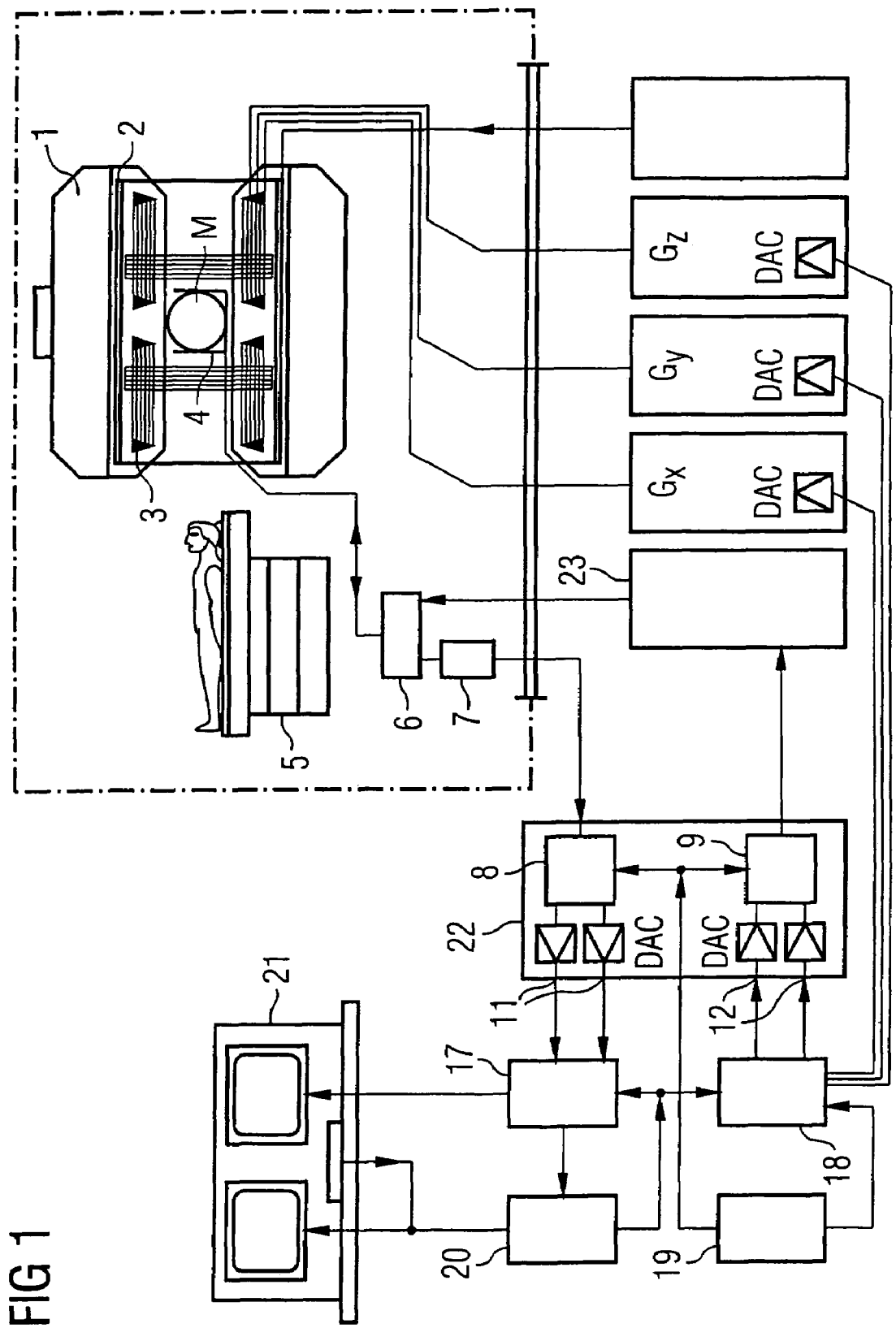
FIG. 1 is a schematic block diagram of a magnetic resonance tomography apparatus suitable for implementing the inventive method.
Figure 2A:
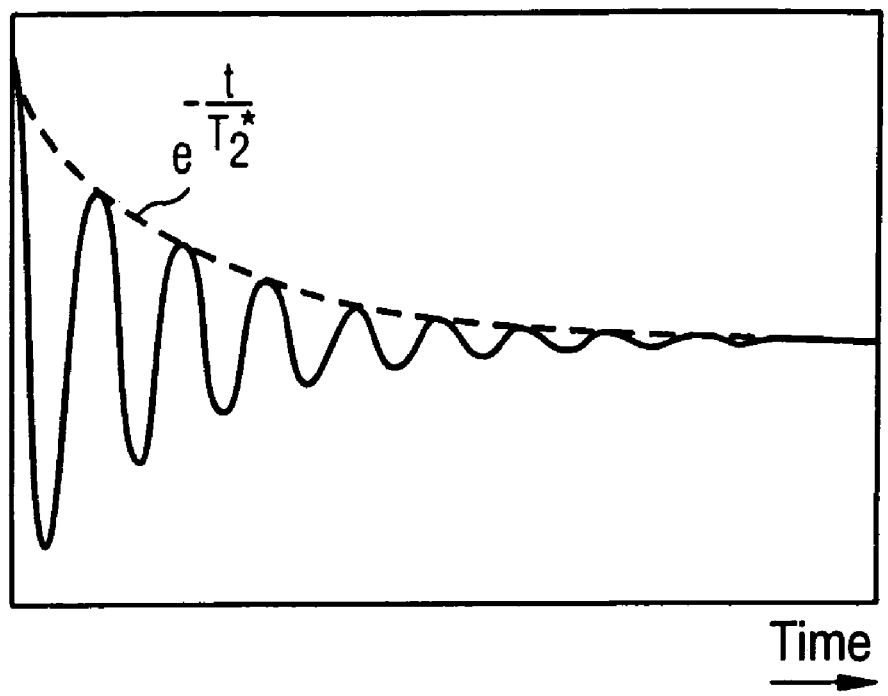
FIG. 2A shows, in the form of an FID signal, the time curve of the transverse magnetization that is characterized by a single resonance.
Figure 2B:
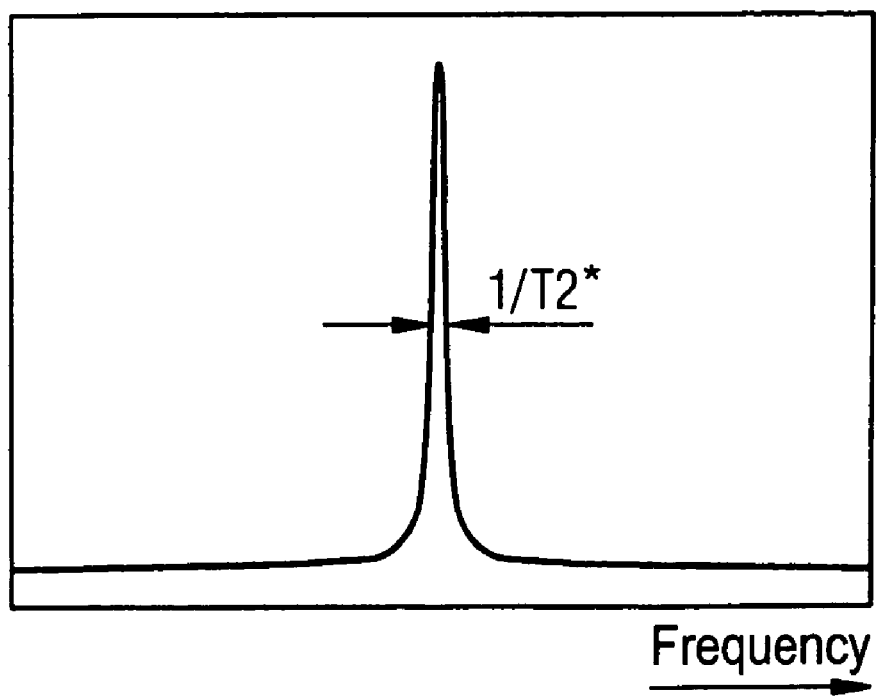
FIG. 2B shows the frequency spectrum of the signal of FIG. 2A, generated by Fourier transformation.
Figure 3A:
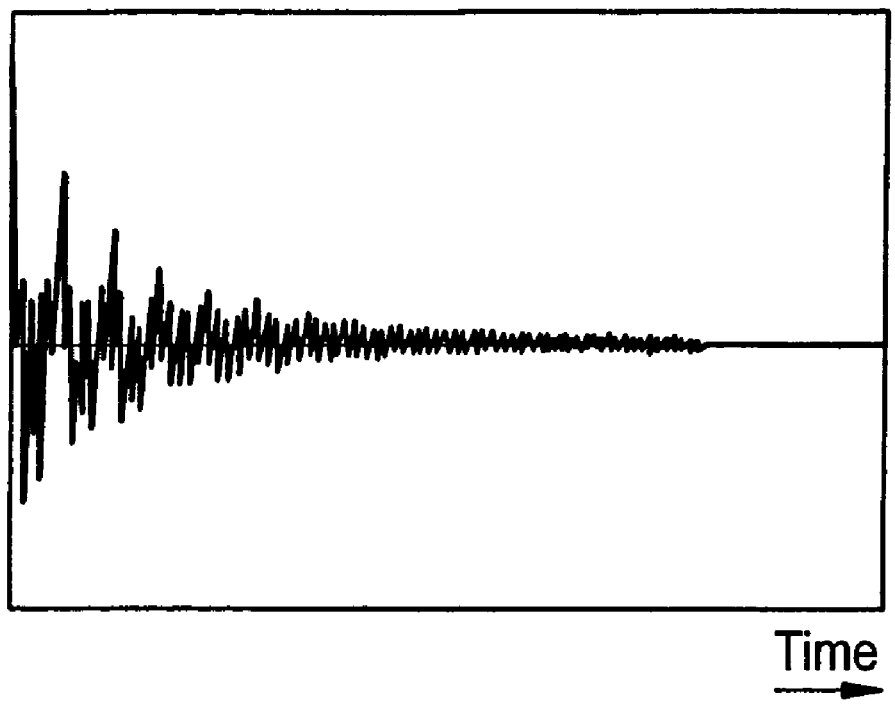
FIG. 3A shows an FID signal which containing three resonances.
Figure 3B:
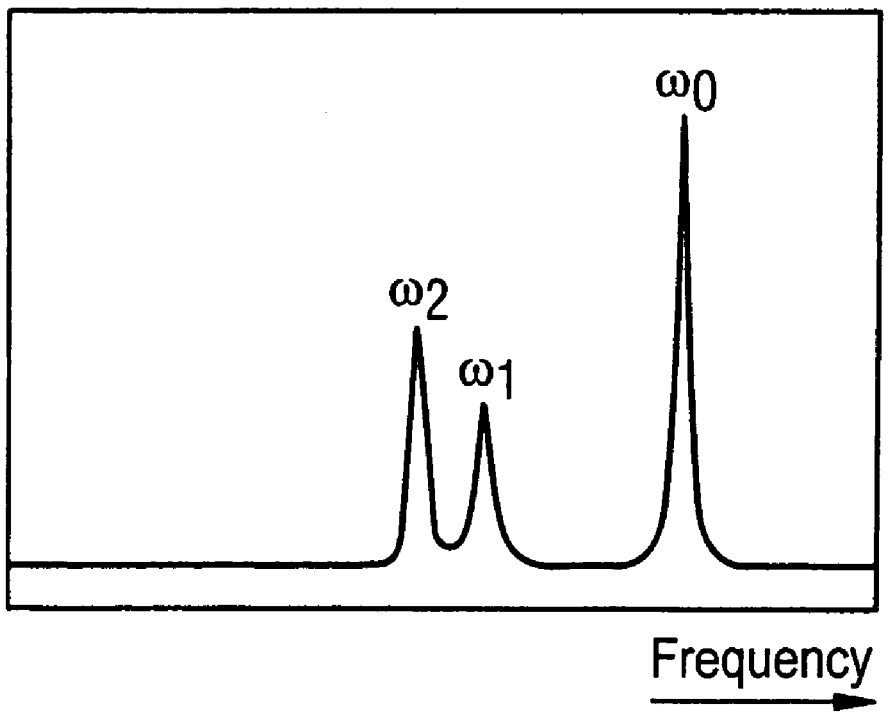
FIG. 3B shows the frequency spectrum of the signal of FIG. 3A with three resonance lines.
Figure 4A:
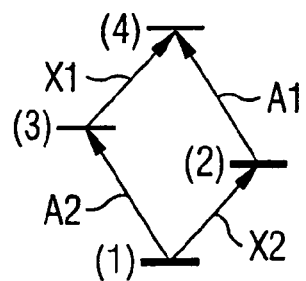
FIG. 4A shows a simplified term scheme of an AX system composed of a sensitive nucleus (A) and an insensitive nucleus (X) in equilibrium state.
Figure 4B:
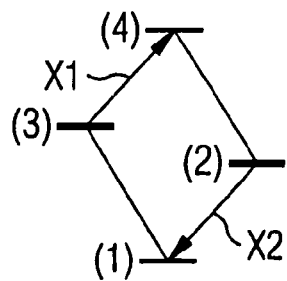
FIG. 4B shows the AX term scheme in disturbed equilibrium after selective population inversion between the states (1) and (3).
Figure 4C:
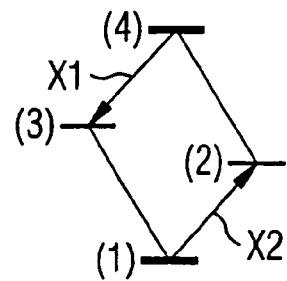
FIG. 4C shows the AX term scheme in disturbed equilibrium after selective population inversion between the states (2) and (4).
Figures 8A, 8B:
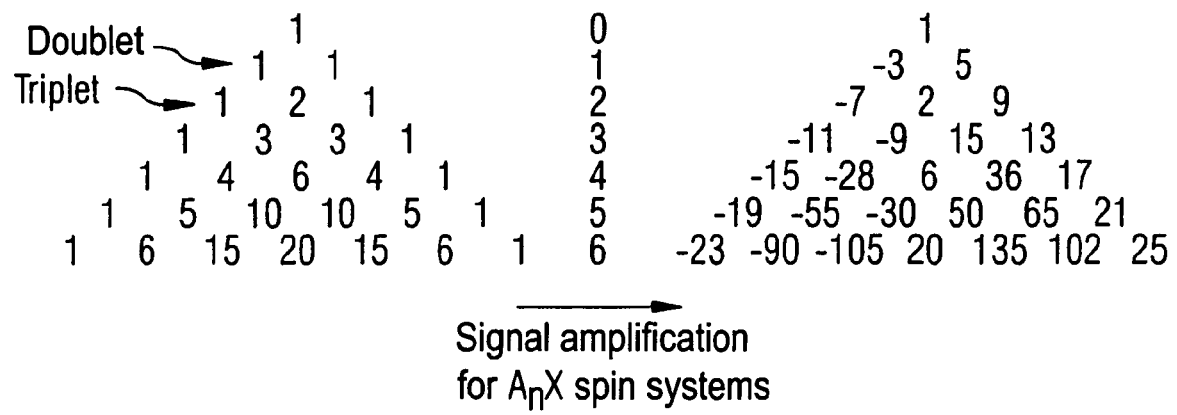
FIG. 8A shows the Pascal triangle of the relative intensities of a multiplet given Boltzmann distribution.
FIG. 8B shows the Pascal triangle of the relative intensities of a multiplet after population inversion.
Figure 6A:
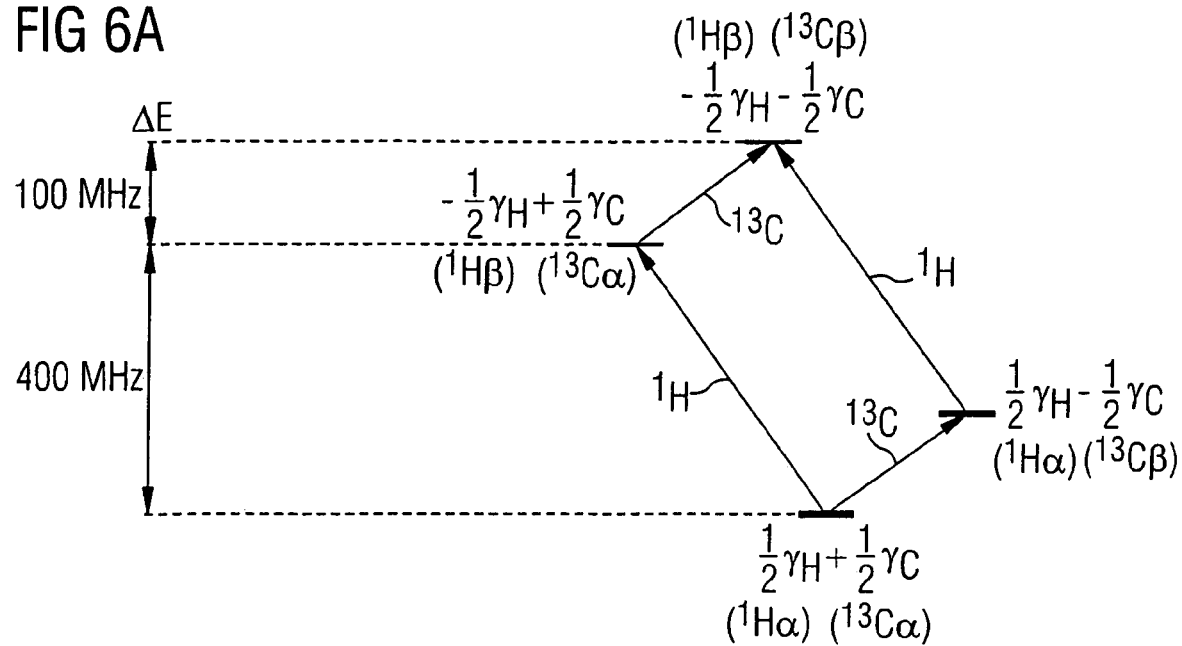
FIG. 6A shows a quantitative representation of the term scheme according to FIG. 4A.
Figure 6B:
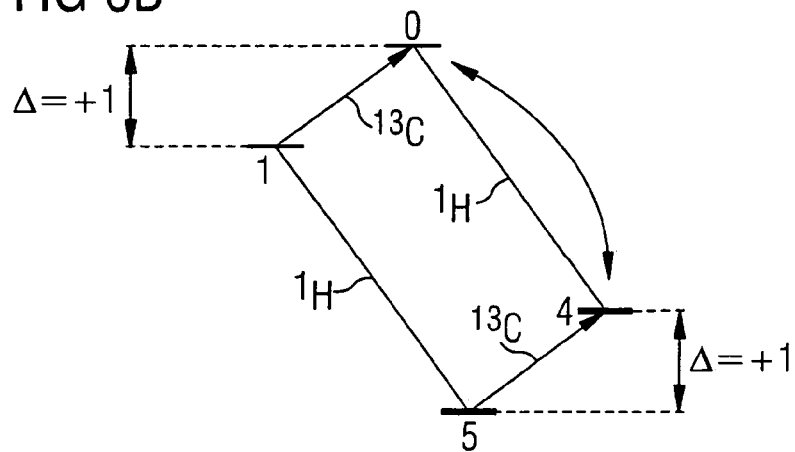
FIG. 6B shows the term scheme according to FIGS. 4A and 6A in a clear depiction of the relative population probabilities.
Figure 6C:
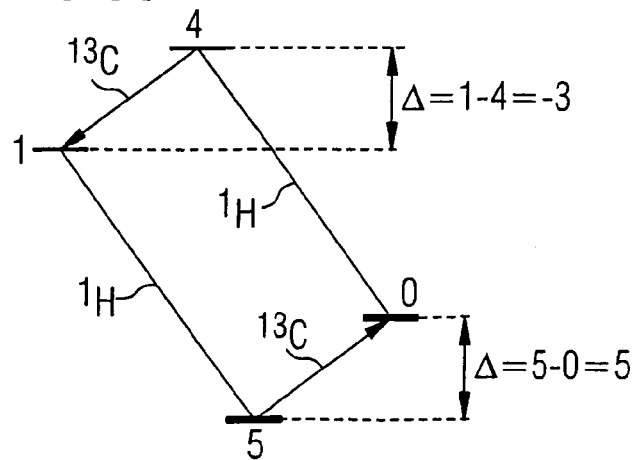
FIG. 6C quantitatively shows the effect of polarization transfer on the signal amplification in the term scheme according to FIG. 4C.
Figure 7A:
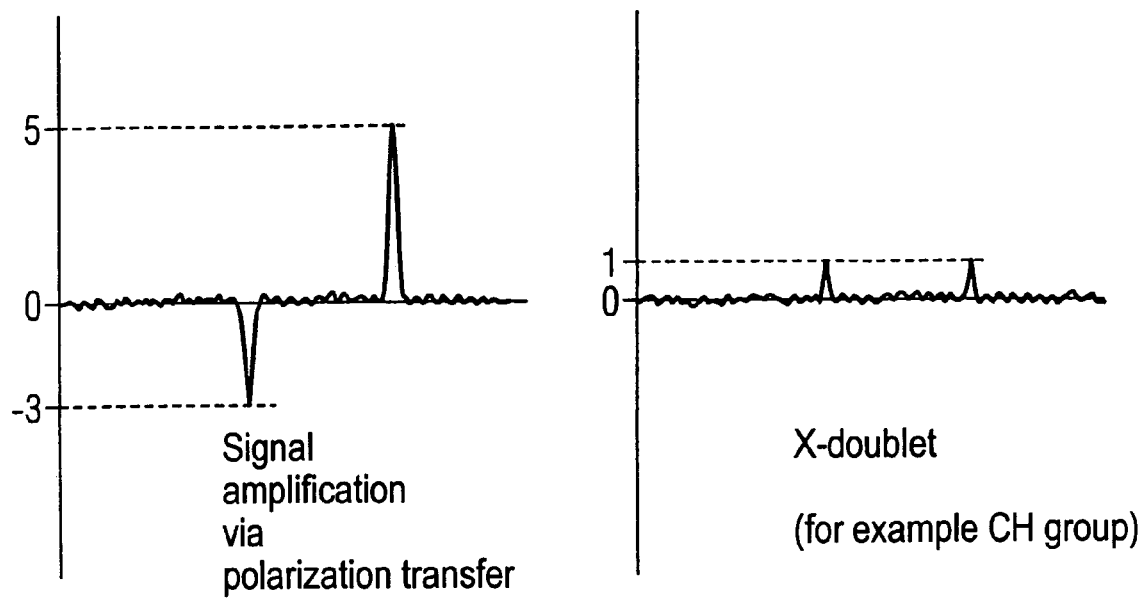
FIG. 7A shows the signal amplification of an X-doublet in the MR spectrum.
Figure 7B:
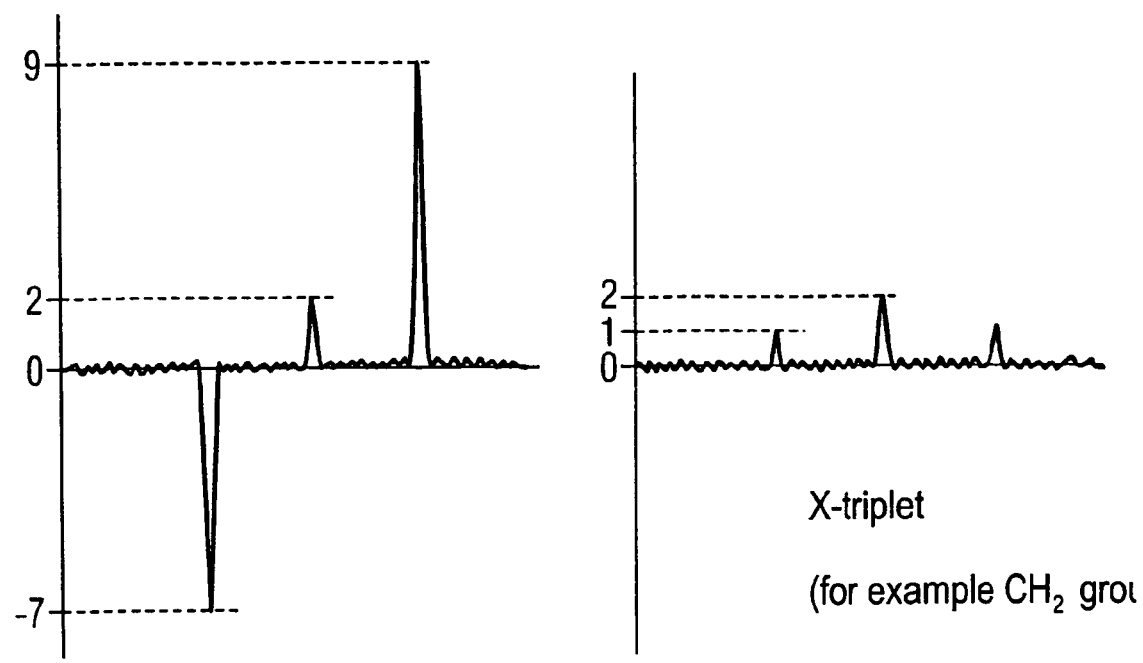
FIG. 7B shows the signal amplification of an X-triplet in the MR spectrum.

FIG. 1 is a schematic representation of a magnetic resonance tomography apparatus with which clinical MR spectroscopy measurements can be conducted and with which the realization of modified sequences for polarization transfer-based detection improvement according to the present invention is possible. The design of the magnetic resonance tomography apparatus thereby corresponds to that of a conventional tomography apparatus, except for the differences described below. A basic field magnet 1 generates a temporally-constant strong magnetic field for polarization or alignment of the nuclear spins in the examination region of a subject (such as, for example, a part of a human body to be examined). The high homogeneity of the basic magnetic field required for the magnetic resonance acquisition is defined in a spherical measurement volume M into which the parts of the human body to be examined are introduced. Shim plates made from ferromagnetic material are mounted at suitable points to support the homogeneity requirements and in particular to eliminate temporally-invariable influences. Temporally-variable influences are eliminated by shim coils 2 that are activated by a shim power supply 14.

A cylindrical gradient coil system 3 that has three sub-windings is used in the basic field magnet 1. Each sub-winding is supplied by an amplifier 15 with current for generation of a linear gradient field in the respective direction of the Cartesian coordinate system. The first sub-winding of the gradient fields 3 generates a gradient of the magnetic field in the x-direction ($G_x$), the second sub-winding generates a gradient in the y-direction ($G_y$) and the third sub-winding generates a gradient in the z-direction ($G_z$). Each amplifier has a digital-analog converter that is controlled by a sequence controller 18 for time-accurate generation of the gradient pulses.

Located within the gradient fields 3 is a radio-frequency antenna 4 that converts the radio-frequency pulses emitted by a radio-frequency power amplifier 23 into an alternating electromagnetic field for excitation of the nuclei and alignment of the nuclear spins of the subject to be examined, or of the region of the subject to be examined. The alternating field emanating from the precessing nuclear spins, i.e. normally the magnetic resonance echo signals caused by a pulse sequence composed of one or more radio-frequency pulses and one or more gradient pulses, is also converted by the radio-frequency antenna 4 into a voltage that is supplied via an amplifier 7 to a radio-frequency acquisition channel 8 of a radio-frequency system 22. The radio-frequency system 22 furthermore has a transmission channel 9 in which are generated the radio-frequency pulses for the excitation of the nuclear magnetic resonance. The respective radio-frequency pulses are digitally represented in the sequence controller 18 as a series of complex numbers based on a pulse sequence predetermined by the system computer 20. This number series is supplied as a real part and an imaginary part, respectively, to a digital-analog converter in the radio-frequency system 22 via an input 12 and supplied from this radio-frequency system 22 to a transmission channel 9. In the transmission channel 9 the pulse sequences are modulated on a radio frequency carrier signal having a base frequency corresponding to the resonant frequency of the nuclear spins in the measurement volume.

The switching from transmission mode to reception mode ensues in a transmission-reception diplexer 6. The radio-frequency antenna 4 radiates the radio-frequency pulses for excitation of the nuclear spins into the measurement volume M and samples resulting echo signals. The correspondingly-acquired magnetic resonance signals are phase-sensitively demodulated in the reception channel 8 of the radio-frequency system 22 and are converted by a respective analog-digital converters into the real part and the imaginary part of the measurement signal. An image or a spectrum is reconstructed by an image computer 17 from the measurement data acquired in this manner. The administration of the measurement data, the image data and the control programs ensues via the system computer 20. According to a selected control program, the sequence controller 18 controls the generation of the respective desired pulse sequences and the corresponding sampling of k-space. The sequence controller 18 in particular controls the time-accurate switching of the gradients, the emission of the radio-frequency pulses with defined phase and amplitude and the acquisition of the nuclear magnetic resonance signals and thus, when suitably programmed operates the apparatus according to the inventive method. The time base for the radio-frequency system 22 and the sequence controller 18 is provided by a synthesizer 19. The selection of the control program for generation of a magnetic resonance image or spectrum as well as the display of the generated nuclear magnetic resonance image or spectrum ensues via a terminal (console) 21 that has a keyboard as well as one or more screens.

A number of different MR spectroscopy sequences can be generated and MR localization methods can be realized in clinical application with the MRT apparatus just described. According to the invention, the described MRT apparatus is able to generate pulse sequences in which RF pulses of different frequencies that are to be radiated do not overlap (when considered from a temporal point of view).

This in particular concerns MR data acquisitions that utilize polarization transfer for signal amplification of insensitive nuclei.

Such methods are intended to energetically prepare coupled spin systems of different sensitive nucleus types ($CH$, $CH_2$, $NH$, $NH_2$, . . . ) such that the weakly-sensitive nucleus type increases transitions and thus exhibits intensified emission and/or absorption, which leads to a notable signal increase of this nucleus type in the MR spectrum.

Figure 9A:
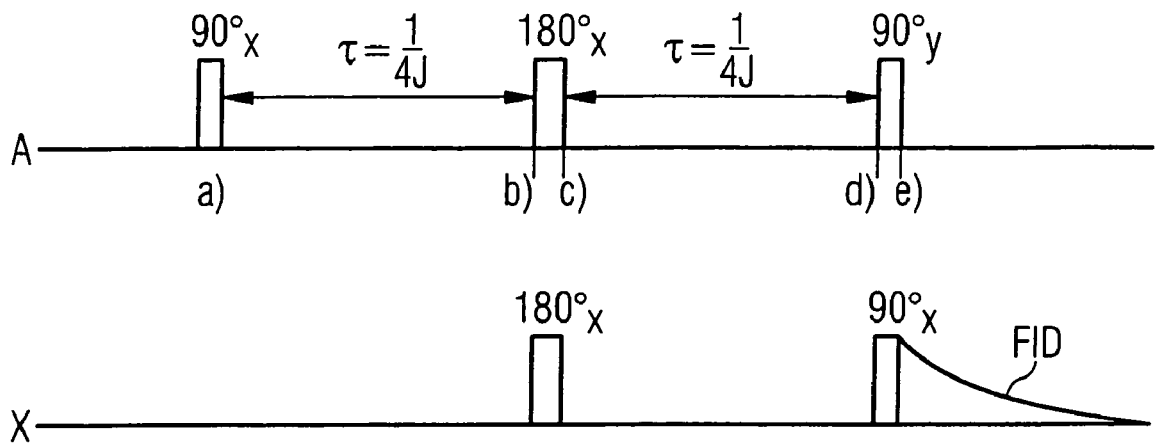
FIG. 9A shows the RF pulse sequence of the INEPT method for an AX system ($^1H$, $^{13}C$).

The method of this general type that is presently best known is INEPT (Insensitive Nuclei Enhanced by Polarization), the RF pulse sequence of which for an AX system is shown in FIG. 9A. The effect of the RF pulse sequence on the AX system is explained step-by-step in the following using the vector diagram from FIG. 9B.

Figure 9B:
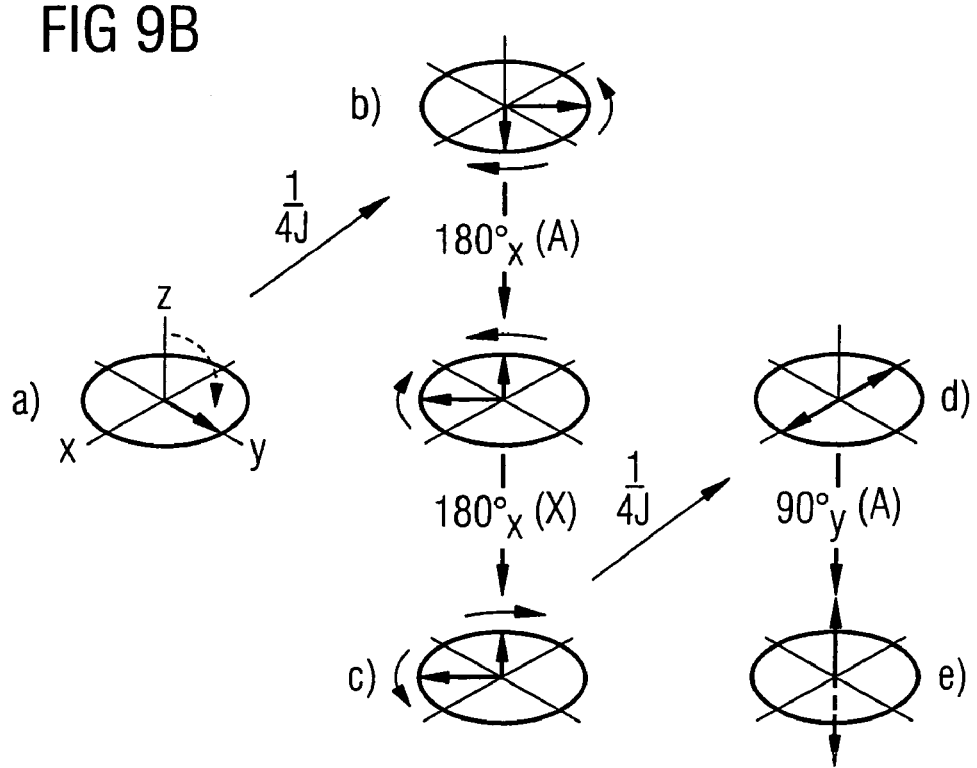
FIG. 9B shows the effect of the RF pulse sequence according to FIG. 9A on the A-magnetization in a vector diagram (vector diagram of the protons).

Only the A-magnetization in the rotating reference system (x, y, z) is shown in the vector diagrams of FIG. 9B (rotation frequency $v=v_A$). The magnetization vector of the nuclei A is folded by the $90_x^\circ$ excitation pulse (a). Due to the spin-spin coupling with the insensitive nucleus type X the transverse magnetization of the nucleus A experiences a division into two energetically-different doublet vectors that as such exhibit different precession in $B_0$. After a time $$\tau = \frac{1}{4J}$$

a phase difference of 90° (b) exists between the two doublet vectors. The $180_x^\circ$ pulse in the A range mirrors the two A-vectors on the x-axis with their rotation direction being retained.

The $180_x^\circ$ pulse in the X range rotates all X spins by 180° such that the spin-spin coupling in the AX system is inverted, which leads to a reversal of the precession direction of the two doublet vectors (c) such that these now couple to the inverted X-magnetic field. The reversal of the rotation direction of both doublet vectors leads to the state (d), in which both A-vectors exhibit contrary directions, being reached after the time $2\tau$ (since radiation of the $90_x^\circ$ pulse). A $90_y^\circ$ pulse inverts the magnetization for an A-line (e), which corresponds to a selective population inversion (a population increase of the AX spin states antiparallel to $B_0$ ensues).

The polarization of the spin system is ultimately detected by a 90° pulse in the frequency range of the insensitive nucleus X whose MR lines now show intensified emission and absorption. It is insignificant where in the x-y plane the magnetization vector of the X-nuclei come to lie; for example, a flipping of the X-magnetization in the y-direction (not shown) via a $90_x^\circ$ pulse and subsequent readout of the FID signal (a $90_y^\circ$ pulse would, for example, be just as easily possible) ensues in FIG. 9A.

The "Refocused INEPT" method represents a variant of the INEPT method in which an additional spin-echo sequence is appended to the sequence of FIG. 9A (for example $\tau_2-180_x^\circ$ (A,X)$-\tau_2$ with $$\tau_2 = \frac{1}{4J}$$

for a doublet).

The X-resonance can then be detected as a positively-polarized doublet. Since the evolution time of the pulse series in Refocused INEPT is based on the AX coupling, this must initially be estimated when J(A,X) is not known.

The DEPT method (Distortionless Enhancement by Polarization Transfer) represents another polarization transfer method for detection improvement that is less sensitive for the selection of the A,X coupling and that supplies X-multiplets without artifacts with regard to relative intensity and line count.

Except for the modulation of the transverse magnetization of the sensitive nucleus (A) via a coupling with the insensitive nucleus (X), the (repeated) simultaneous application of RF pulses (combination of 180°, 90° or θ pulses) in the A-range and X-range is common to all methods.

Presently no polarization transfer-based signal improvement methods can be implemented with MR apparatuses (tomographs or spectrometers) that are not capable of supplying the simultaneous RF pulse application of different frequency ranges.

According to the present invention, it is therefore proposed to modify the RF pulse sequence of the refocused INEPT method or, respectively, of the DEPT method such that RF pulses to be radiated do not coincide or overlap (considered from a temporal point of view).

In the example of the refocused INEPT sequence, this entails the insertion of new RF pulse time intervals $T_1$, $T_2$, $T_3$, $T_{22}$, $T_4$, $T_{23}$, and $T_5$ that allow for the correct precession curves of the nucleus type-specific magnetization vectors.

Figure 10:
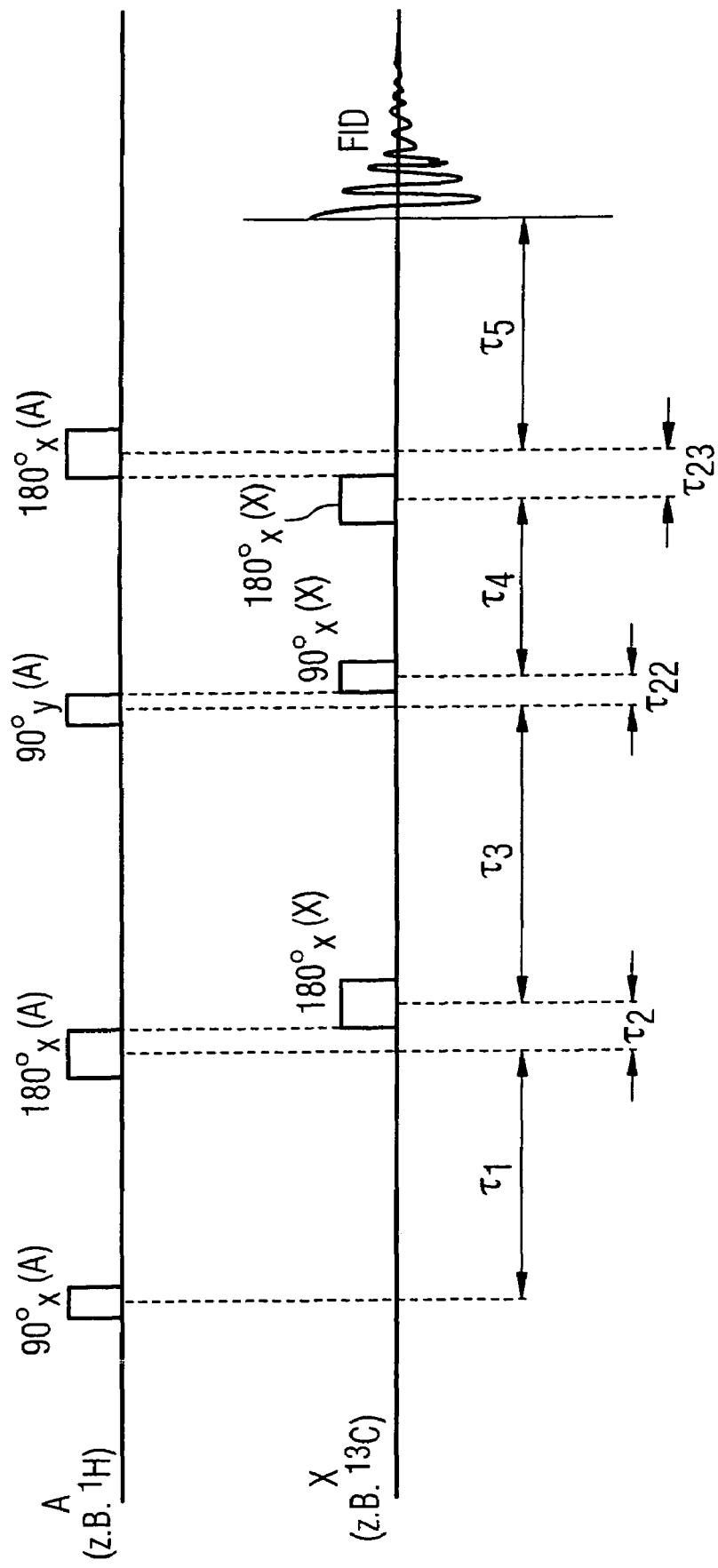
FIG. 10 shows an embodiment of the inventive modification of the RF pulse sequence of a refocused INEPT method for an AX system.

FIG. 10 shows such an inventive sequence schematic for a $^1H$-$^{13}C$ system:

$90_x^\circ$ ($^1H$)$-\tau_1-180_x^\circ$ ($^1H$)$-\tau_2-180_x^\circ$ ($^{13}C$)$-\tau_3-\pi_y^\circ$
($^1H$)$-\tau_{22}-90_x^\circ$ ($^{13}C$)$-\tau_4-180_x^\circ$ ($^{13}C$)$-\tau_{23}-180_x^\circ$
($^1H$)$-\tau_5-$ signal acquisition, with the first time interval $T_1$ between 90° pulse and 180° inversion is determined as before from the $^1H$-$^{13}C$ coupling:

$$\tau_1 = \frac{1}{4J} \qquad (10)$$

However, the 180° inversion pulse for the $^1H$ spin system begins only after $T_2$, i.e. after ending the $180_x^\circ$ ($^1H$) pulse radiation. This time interval $T_2$ must amount to at least half of each of the pulse widths of both 180° pulses. This new time interval $T_2$ leads to an extension/modification of the time interval $T_3$ between the two preparation pulses of the $^1$H spin system $180_x°$ ($^1$H)-$90_y°$($^1$H) since the precession of the $^1$H vectors that proceeds in the same direction during $T_2$ must be cancelled. This means the following equality must exist:

$$\tau_3 = \tau_1 + \tau_2 = \frac{1}{4J} + \tau_2 \quad (11)$$

The time segment $T_{22}$ must in turn amount to at least half of the last two 90° pulses. The time $T_4$ follows that depends on the number of the protons (for example, $$\tau_4 = \frac{1}{6J}$$

should apply when the spectrum should include all multiplets).

The time segment $T_{23}$ must in turn amount to at least half of each of the last two 180° pulses.

The FID signal is finally acquired after the time segment $T_5 = T_4 + T_{23}$ after the last 180° ($^1$H) pulse.

In total the sum of the times $T_1$, $T_2$, $T_3$, $T_{22}$, $T_4$, $T_{23}$, and $T_5$ represents the minimum time intervals between all involved RF pulses, which are defined for the most part by the system hardware and ensure that no temporal overlap of RF pulses ensues in the experiment. It should be noted that, as is apparent in all sequence diagrams, all pulses exhibit a certain width and thus must be radiated just before the expiration of the corresponding time interval. The time intervals thus define the separation of the pulses from pulse middle-to-pulse middle.

Such a "timing" can be transferred to other polarization methods such as SINEPT and DEPT and enable them to be used in MR apparatuses that are not equipped with a "multi-nuclei option", i.e. that cannot simultaneously transmit at the various frequencies of the involved nuclei.

Typical measurement parameters for the timing of a sequence according to FIG. 10 are approximately 1200 μs for the pulse length of the 180° pulses, while the minimum interval between two RF pulses is approximately 100 μs, such that a $T_2$ interval of approximately 1300 μs results. As already explained, this $T_2$ interval must be taken into account in the following segment $T_3$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for improving detection of a weakly-sensitive atomic nucleus type in MR spectroscopy, comprising the steps of:
    subjecting an examination subject, containing a strongly-sensitive atomic nucleus type A and an MR-active, weakly-sensitive atomic nucleus type X, to a MR spectroscopic pulse sequence, including radiating a plurality of RF pulses at respectively different frequencies;
    in said MR spectroscopic pulse sequence, radiating said plurality of RF pulses in a sequence with respective, predetermined time intervals between successive RF pulses in said sequence, with none of said RF pulses being radiated simultaneously or overlapping one another, to produce a polarization transfer of said strongly-sensitive atomic nucleus type A and said weakly-sensitive atomic nucleus type X by radiating a first A-selective $90_x°$A RF pulse for excitation of the strongly-sensitive nucleus type A, radiating a second A-selective $180_x°$A RF pulse after a time $T_1$ after the middle of the first RF pulse, radiating a third X-selective $180_x°$X RF pulse after a time $T_2$ after the middle of the second RF pulse, radiating a fourth A-selective $90_y°$A RF pulse after a time $T_3$ after the middle of the third RF pulse, radiating a fifth X-selective $90_x°$X RF pulse after a time $T_{22}$ after the middle of the fourth RF pulse, radiating a sixth X-selective $180_x°$X RF pulse after a time $T_4$ after the middle of the fifth RF pulse; and
    acquiring a magnetic resonance signal as an FID signal from said subject after a time $T_5$ after the middle of the seventh RF pulse, and electronically analyzing said magnetic resonance signal to obtain MR spectroscopic information therefrom.

2. A method as claimed in claim 1 wherein said strongly sensitive atomic nucleus type A and said weakly-sensitive atomic nucleus type X have a coupling constant J representing coupling therebetween, and comprising setting $T_1 = \frac{1}{4}J$.

3. A method as claimed in claim 2 comprising setting $T_2$ as at least a sum of half of said second A-selective $180_x°$A RF pulse and half of said third X-selective $180_x°$X RF pulse.

4. A method as claimed in claim 3 comprising setting $T_3 = T_1 + T_2$.

5. A method as claimed in claim 4 comprising setting $T_{22}$ as at least a sum of half of the fourth A-selective $90_y°$A RF pulse and half of the fifth X-selective $90_x°$X RF pulse.

6. A method as claimed in claim 5 comprising setting $T_4 = \frac{1}{6}J$.

7. A method as claimed in claim 6 comprising setting $T_{23}$ as at least a sum of half of the sixth X-selective $180_x°$X RF pulse and half of the seventh A-selective $180_x°$A RF pulse.

8. A method as claimed in claim 7 comprising setting $T_5 = T_4 + T_{23}$.

9. A method as claimed in claim 2 comprising using, as said coupling J, coupling for an X multiplet of an $A_nX$ group, wherein n=1, 2, 3, . . . .

10. A method as claimed in claim 1 comprising exciting $^1$H nuclei with said RF pulses in said MR spectroscopic pulse sequence, as said strongly-sensitive atomic nucleus type A.

11. A method as claimed in claim 1 comprising exciting $^{13}$C nuclei with said RF pulses in said MR spectroscopic pulse sequence, as said weakly-sensitive atomic nucleus type X.

12. An MR spectroscopy apparatus for improving detection of a weakly-sensitive atomic nucleus type comprising:
    an MR scanner adapted to interact with an examination subject containing a strongly-sensitive atomic nucleus type A and a MR-active, weakly-sensitive atomic nucleus type X, said MR scanner comprising a basic field magnet, gradient coils and an RF resonator arrangement;
    a sequence controller that operates said MR scanner to subject said examination subject to a MR spectroscopic pulse sequence, including radiating a plurality of RF pulses from said RF resonator arrangement at respectively different frequencies;
    said sequence controller, in said MR spectroscopic pulse sequence, causing said RF resonator arrangement to radiate said plurality of RF pulses in a sequence with respective, predetermined time intervals between successive RF pulses in said sequence, with none of said RF pulses being radiated simultaneously or overlapping one another, to produce a polarization transfer of said strongly-sensitive atomic nucleus type A and said weakly-sensitive atomic nucleus type X, by radiating a first A-selective $90_x°A$ RF pulse for excitation of the strongly-sensitive nucleus type A, radiating a second A-selective $180_x°A$ RF pulse after a time $T_1$ after the middle of the first RF pulse, radiating a third X-selective $180_x°X$ RF pulse after a time $T_2$ after the middle of the second RF pulse, radiating a fourth A-selective $90_y°A$ RF pulse after a time $T_3$ after the middle of the third RF pulse, radiating a fifth X-selective $90_x°X$ RF pulse after a time $T_{22}$ after the middle of the fourth RF pulse, radiating a sixth X-selective $180_x°X$ RF pulse after a time $T_4$ after the middle of the fifth RF pulse; said RF resonator arrangement and said gradient coils to acquire a magnetic resonance signal as an FID signal from said subject after a time $T_5$ after the middle of the seventh RF pulse; and a computer that electronically analyzes said magnetic resonance signal to obtain MR spectroscopic information therefrom.

* * * * *